United States Patent [19]

Saeki

[11] Patent Number: 5,506,423
[45] Date of Patent: Apr. 9, 1996

[54] SEMICONDUCTOR LIGHT-EMITTING DEVICE WITH ZNTE CURRENT SPREADING LAYER

[75] Inventor: Ryo Saeki, Chiba, Japan

[73] Assignee: Kabushiki Kaisha Toshiba, Kanagawa, Japan

[21] Appl. No.: 274,842

[22] Filed: Jul. 14, 1994

[30] Foreign Application Priority Data

Jul. 22, 1993 [JP] Japan ........................ 5-181224

[51] Int. Cl.$^6$ ............................ H01L 33/00; H01S 3/19
[52] U.S. Cl. ............... 257/97; 257/94; 257/200; 257/614; 257/96; 372/44; 372/49
[58] Field of Search ......................... 257/200, 98, 94, 257/97, 614, 96; 372/43, 44, 49

[56] References Cited

U.S. PATENT DOCUMENTS 5,274,248  12/1993  Yokogawa ........................ 257/97
5,300,791  4/1994  Chen et al. ........................ 257/94

FOREIGN PATENT DOCUMENTS 59-11688  1/1984  Japan ........................ 257/94

OTHER PUBLICATIONS

"High-efficiency InGaAlP/GaAs visible light-emitting diodes", H. Sugawara et. al., Appl. Phys. Lett., 58(10) :1010–1012 (1991).

Primary Examiner—Jerome Jackson, Jr.
Attorney, Agent, or Firm—Finnegan, Henderson, Farabow, Garrett & Dunner

[57] ABSTRACT

A semi-conductor light-emitting device has a substrate, an active layer formed on the substrate for emitting light when an electric current is supplied, a current spreading layer formed on the active layer for spreading an electric current, a light-outputting layer formed on the current spreading layer, and electrodes provided on the semiconductor substrate and the light emitting layer for providing electric current to the active layer. In the device, the current spreading layer is formed of zinc telluride (ZnTe).

7 Claims, 6 Drawing Sheets

X : THICKNESS

X : THICKNESS

X : THICKNESS

X : THICKNESS

SEMICONDUCTOR LIGHT-EMITTING DEVICE WITH ZNTE CURRENT SPREADING LAYER

BACKGROUND OF THE INVENTION

1. Field of the Invention

The present invention relates to a light-emitting semiconductor device with high brilliancy in yellow-green to green colors, and, in particular, to a light-emitting semiconductor device used as a light source for signals, information boards, and the like displayed outdoors.

2. Description of the Prior Art

A light emitting diode of a four-element crystal of the InGaAlP type for emitting green light of ultrahigh brilliancy has, for example, a structure as shown in sectional view in FIG. 1.

In FIG. 1, a buffer layer 102 made from n-GaAs is formed by lamination on an n-type GaAs substrate 101 with Si as a dopant obtained by slicing in a direction angled at 15° observed from an obtained surface direction (or Miller indices) [100]. In addition, the conventional light emitting diode includes a cladding-active layer-cladding double heterostructure (DH). Specifically, as shown in FIG. 1, cladding layer 103 includes n-$In_{0.5}(Ga_{0.3}Al_{0.7})_{0.5}P$; active layer 104 is made of n-$In_{0.5}(Ga_{0.6}Al_{0.4})_{0.5}P$; and cladding layer 105 is formed of p-$In_{0.5}(Ga_{0.3}Al_{0.7})_{0.5}P$. The cladding-active layer-cladding structure is fabricated using MOCVD.

Also, a current spreading layer 106 made from $p^+$-$Ga_{0.3}Al_{0.7}As$, which diffuses an injected current to all elements and expands the light-emitting area, is formed by lamination on the clad layer 105. A pair of electrodes 107 for supplying electric current to the active layer 104 is formed, one on the exposed surface of the current spreading layer 106 and one on the GaAs substrate 101.

In the semiconductor light emitting device having this type of structure, not all the light of the light-emission wavelength band of yellow-green light to green light (580 nm to 560 nm) radiated from the active layer 104 is passed through the p-$Ga_{0.3}Al_{0.7}As$ which forms the current spreading layer 106. Specifically, about 20% to 40% of the light radiated from the active layer 104 is absorbed by the current spreading layer 106. Therefore, about 60% of the light obtained from the active layer 104 is merely transmitted to the exterior of the device. A light emitting efficiency of only about 0.2% is attained.

As can be understood from the foregoing explanation, in a conventional green light emitting diode, the light transmittance of green light from the current spreading layer 106 is extremely low, therefore part of the light emitted from the active layer 104 is absorbed by the current spreading layer 106. Therefore the light emission efficiency drops. This is an obstacle to obtaining high brilliancy.

SUMMARY OF THE INVENTION

Accordingly, an object of the present invention is, with due consideration to the drawbacks of such conventional semiconductor light-emitting devices, to provide a green light-emitting semiconductor device which attains a high light emission efficiency at high brilliancy by strikingly increasing the light transmittance of the current spreading layer.

As a preferred embodiment according to the present invention, a semiconductor light-emitting device comprises:

a semiconductor substrate;

an active layer formed on the semiconductor substrate for emitting light when an electric current is supplied;

a current spreading layer formed on the active layer for spreading an electric current;

a light-outputting layer formed on the current spreading layer; and electrodes provided on the semiconductor substrate and the light emitting layer for providing electric current to the active layer, wherein the current spreading layer is formed of zinc telluride (ZnTe).

In the device described above, the resistivity of the current spreading layer is 0.1 Ωcm or less.

In the device above, the film thickness of the current spreading layer is about 7 μm.

In the device described above, the device further comprises a reflective layer formed between the active layer and the current spreading layer for reflecting light emitted from the active layer to the current spreading layer.

In the device described above, the device further comprises a current blocking layer formed in the current spreading layer for locally preventing the flow of electric current supplied from the electrodes to the active layer.

In the device described above, the device further comprises: a reflective layer formed between the active layer and the current spreading layer for reflecting light emitted from the active layer to the current spreading layer side; and a current blocking layer formed in the current spreading layer for locally preventing the flow of electric current supplied from the electrodes to the active layer.

In the device described above, the resistivity of the current spreading layer is about 0.05 Ωcm.

In the above-described configuration, light radiated to the light outputting surface side from the light-emitting layer in the present invention is not absorbed in the current spreading layer.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

An embodiment of the present invention will now be explained with reference to the drawings.

Figure 2:
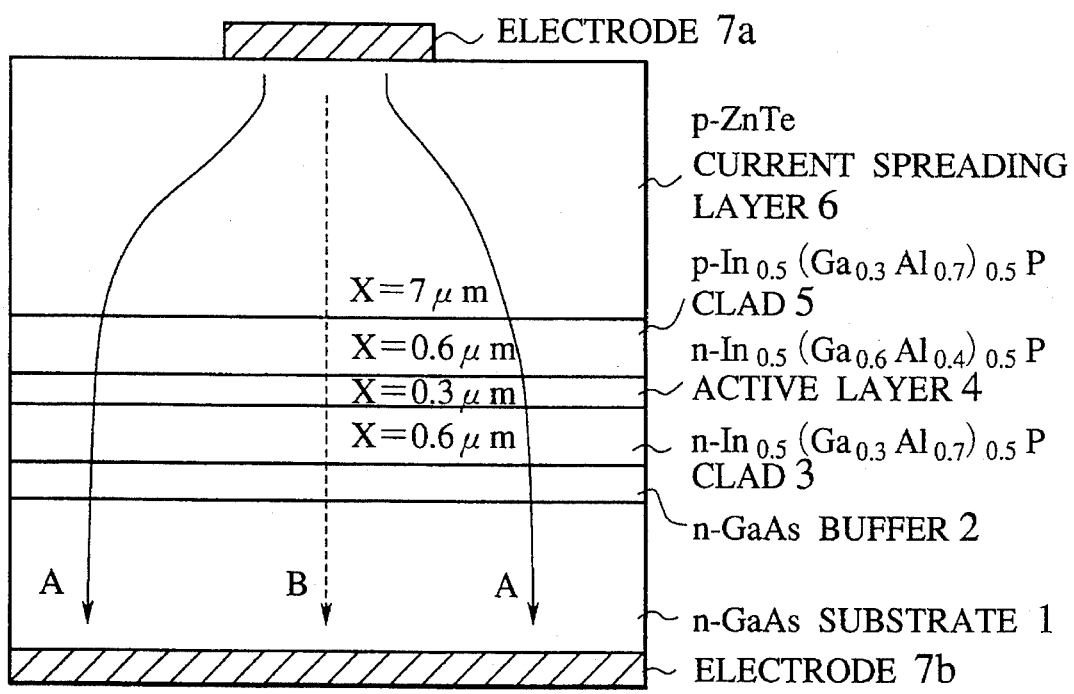
FIG. 2 is a sectional view showing the structure of a first embodiment of a light-emitting semiconductor device of the present invention.

FIG. 2 is a sectional view showing the structure of a first embodiment of a light-emitting semiconductor device of the present invention.

As illustrated in FIG. 2, a buffer layer 2 made from n-GaAs formed using the MOCVD method; a clad layer 3 of a thickness of about 0.6 μm made from n-$In_{0.5}(Ga_{0.3}Al_{0.7})_{0.5}P$ with Si as a dopant; an active layer 4 of a thickness of about 0.3 μm made from undoped n-$In_{0.5}(Ga_{0.6}Al_{0.4})_{0.5}P$; and a clad layer 5 of a thickness of about 0.6 μm made from p-$In_{0.5}(Ga_{0.3}Al_{0.7})_{0.5}P$ with Zn as a dopant are formed in succession on an n-type GaAs substrate 1 obtained by slicing in a direction angled at 15° seen from a surface direction (or Miller indices) of [100] with Si as a dopant.

A current spreading layer 6 of a thickness of about 7 μm made from p-ZnTe (zinc telluride) doped with phosphorous (P) or nitrogen (N) is grown propagated on the clad layer 5. The current spreading layer 6 may be formed using the MOCVD method as a continuation of the growth of the buffer layer 2, the clad layers 3, 5, and the active layer 4, or, may be formed using the MBE method, the MOMBE method, or the VPE method.

The ZnTe of the current spreading layer 6 formed in this manner has a carrier density of about $1 \times 10^{18}$ cm$^{-3}$ or less and a resistivity of about 0.05 Ωcm. The low resistivity is particularly necessary. An electrode 7a is formed on the top of the current spreading layer 6 and an electrode 7b is formed on the exposed surface of the GaAs substrate 1 for supplying an electric current to the active layer 4.

When the resistivity of the current spreading layer 6 is 0.05 Ωcm or less, the current flows in the direction indicated by the arrows A and light is emitted from both ends of the active layer 4, therefore the efficiency of light emission is good. When the resistivity is greater than 0.05 Ωcm, the current flows in the direction indicated by the arrow B and light is emitted inside the active layer 4, therefore the efficiency of light emission is poor.

Figure 3:
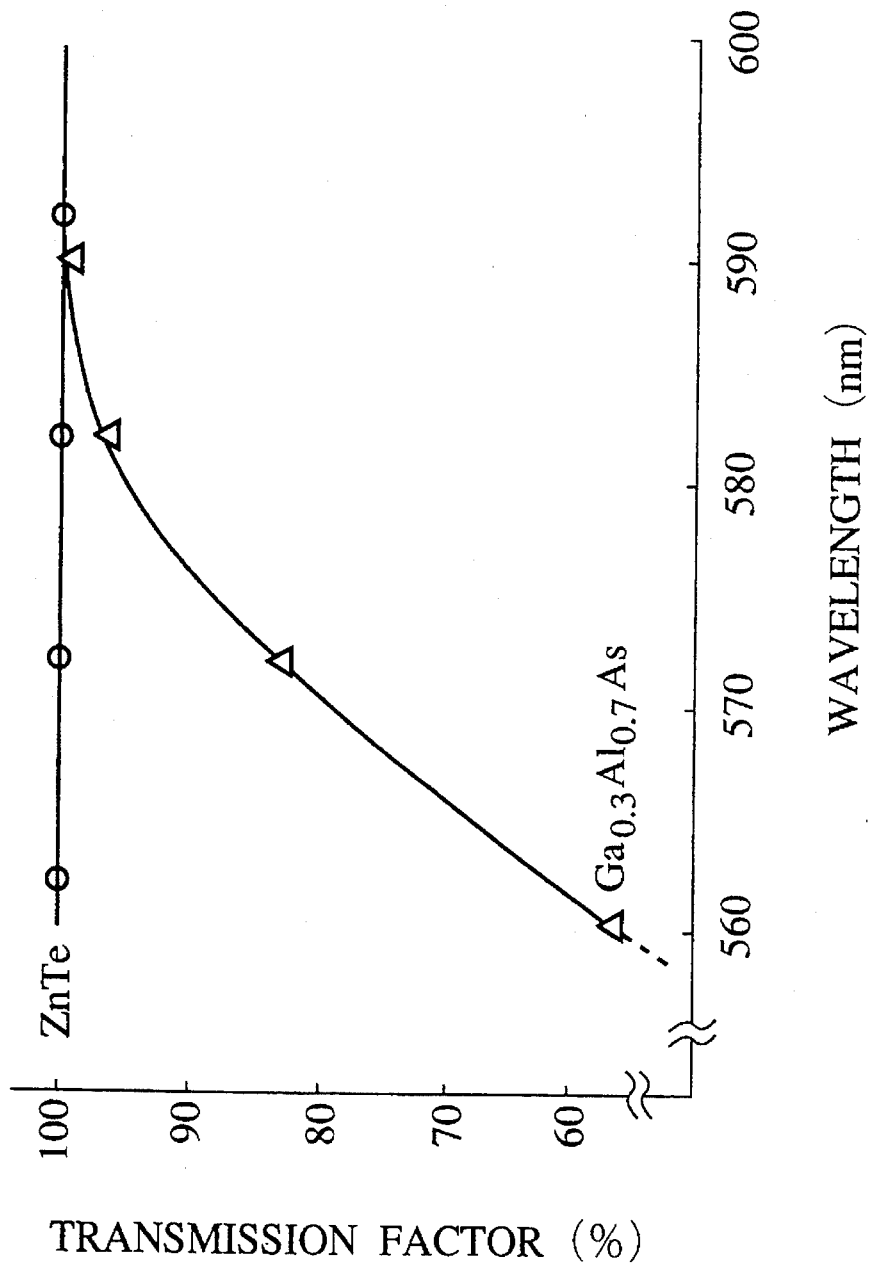
FIG. 3 is a graph showing the transmission factors of the materials forming the current spreading layer of the first embodiment of a light-emitting semiconductor device of the present invention shown in FIG. 2 and of the current spreading layer of the example of the prior art.

In this type of configuration, the transmittance of light emitted in a wave length band from 560 nm to 590 nm in the ZnTe from which the current spreading layer 6 is formed reaches almost 100%, as shown in FIG. 3. It can therefore be clearly seen that the light transmittance improves strikingly in comparison with that of the $Ga_{0.3}Al_{0.7}As$ used conventionally.

Figure 4:
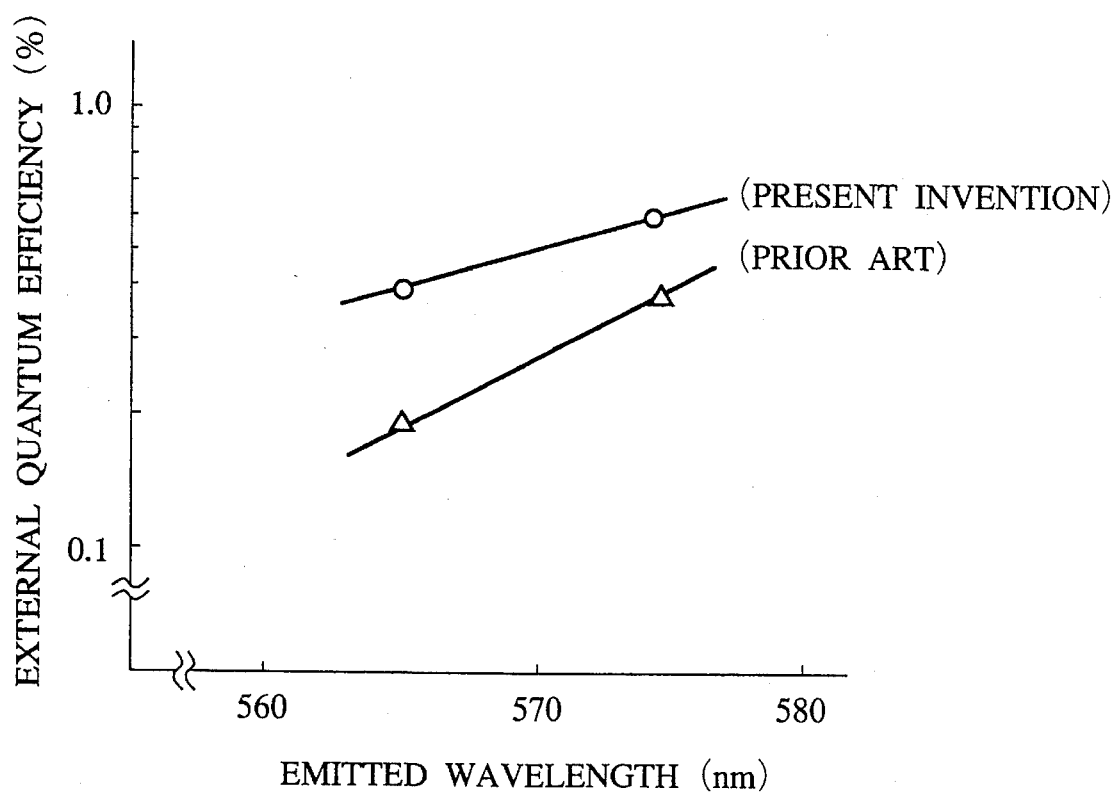
FIG. 4 is a graph showing the relationship between the external quantum efficiency and the emitted wave length for the first embodiment of the light-emitting semiconductor device shown in FIG. 2 and for the example of the prior art.

Accordingly, the light radiating from the active layer 4 is not absorbed in the current spreading layer 6 but is discharged externally. As a result, the external quantum efficiencies of, for example, a yellow-green color of an emitted wave length of about 573 nm and a green color of an emitted wave length of about 565 nm increase from 0.4% to 0.6% and from 0.2% to 0.4% respectively, as shown in FIG. 4. It is also possible to achieve high brilliance.

Figure 5:
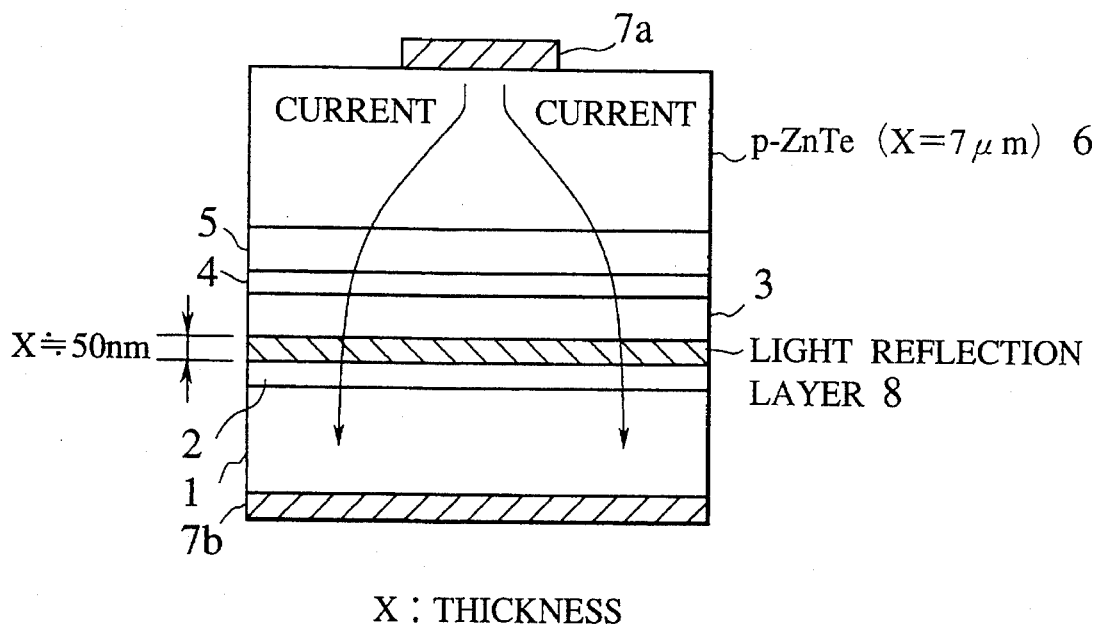
FIG. 5 is a sectional view showing the structure of a second embodiment of a light-emitting semiconductor device of the present invention.

FIG. 5 is a sectional view showing the structure of a second embodiment of a light-emitting semiconductor device of the present invention. In the light-emitting semiconductor device of this embodiment, the current spreading layer 6 which is the special feature of the first embodiment of the light-emitting device shown in FIG. 2 is applied to a light-emitting semiconductor device with a structure which has a reflective layer 8. Specifically, in the second embodiment of the present invention shown in FIG. 5, the reflective layer 8 is provided to the structure of the embodiment of the light emitting device shown in FIG. 2 between the buffer layer 2 and the clad layer 5 for reflecting emitted light to the light-outputting side of the current spreading layer 6. As a result of this configuration the amount of light output is increased in comparison with the configuration shown in FIG. 2 and an even higher brilliance can be attained.

Figure 6:
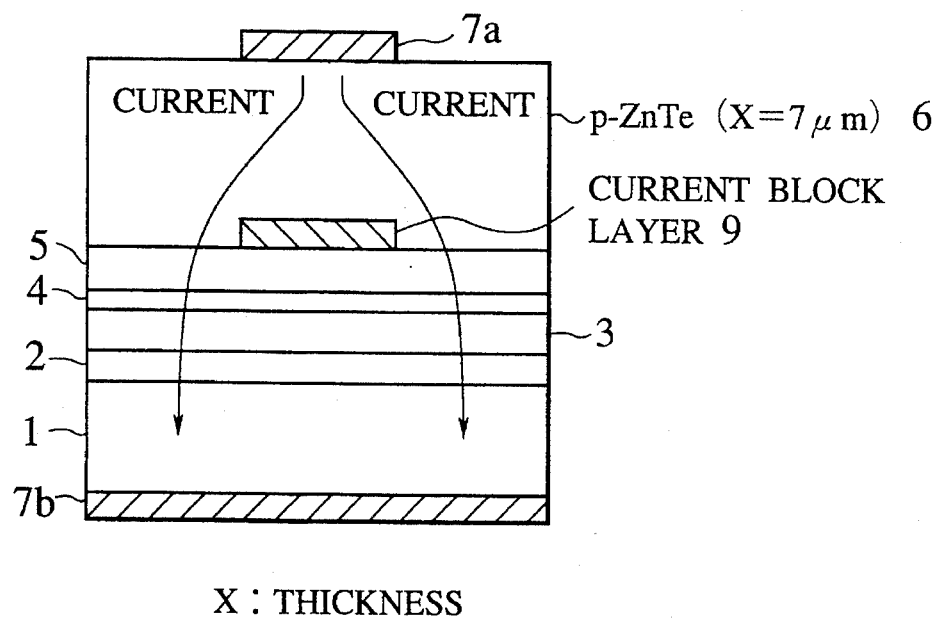
FIG. 6 is a sectional view showing the structure of a third embodiment of a light-emitting semiconductor device of the present invention.

FIG. 6 is a sectional view showing the structure of a third embodiment of a light-emitting semiconductor device of the present invention. In the light-emitting semiconductor device of this embodiment, the current spreading layer 6 which is the special feature of the first embodiment of the light-emitting device is applied to a light-emitting semiconductor device which has a current blocking layer 9. Specifically, in the third embodiment of the present invention shown in FIG. 6, the current blocking layer 9 of almost the same shape as the electrode 7a is provided directly underneath the electrode 7a of the light outputting surface side on the clad layer 5. The light-emitting semiconductor device with this configuration can also attain a high brilliance.

Figure 7:
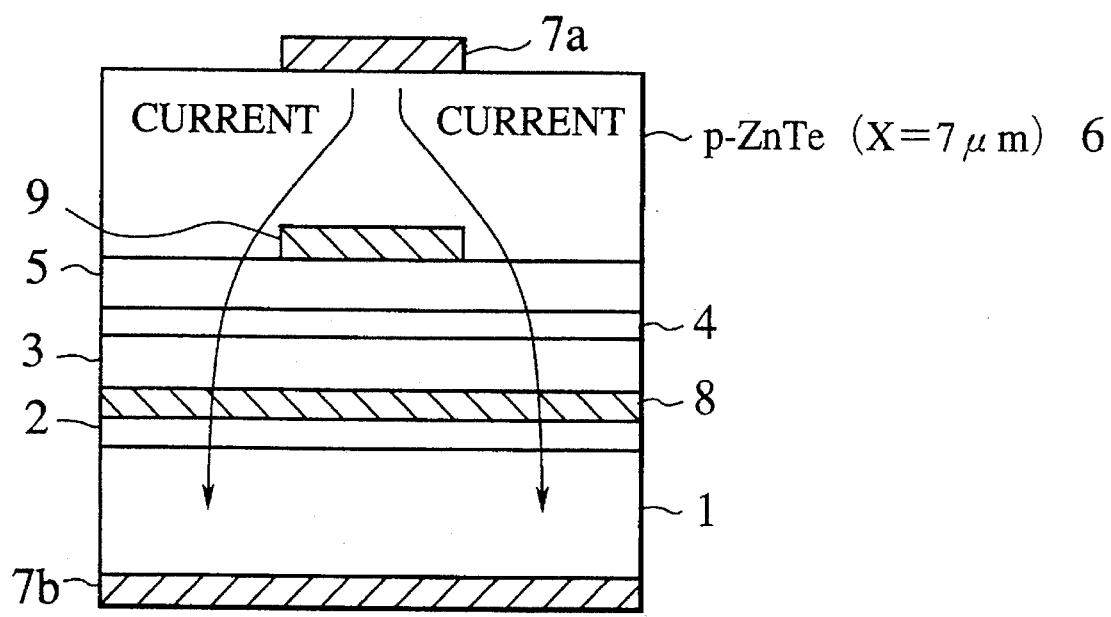
FIG. 7 is a sectional view showing the structure of a fourth embodiment of a light-emitting semiconductor device of the present invention.

Further, without limiting this embodiment of the present invention, it is also acceptable, for example, as shown in FIG. 7, to combine the structure of the second embodiment illustrated in FIG. 5 and the structure of the third embodiment illustrated in FIG. 6. In addition, it is also acceptable to change the color of the emitted light in a range of light-emission wave lengths which can be absorbed by ZnTe by changing the structure of the active layer 4. The types of conductivity of the GaAs substrate and of each layer of the above-described embodiments may also be reversed, and, as shown in FIG. 3, a p-ZnTe current spreading layer 6 can also be applied to a light-emitting device for emitting light of a wave length longer than 560 nm. Further, the present invention can be applied to a light-emitting device of a two-element or three-element crystal. The current spreading layer 6 in the above-described first, second, third, and fourth embodiments of the present invention illustrated in FIG. 2, 5.6, and 7 is made of ZnTe with a resistivity of 0.05 Ωcm. Accordingly, the semiconductor device has a high threshold voltage so that the reliability of the semiconductor light-emitting device is increased. The device can therefore be used in a wide range of applications. In addition, although a resistivity of 0.05 Ωcm or less is desirable for the current spreading layer 6, the same effect is obtained with a resistivity of 0.01 Ωcm or less. Also, because ZnTe is used for the current spreading layer 6, the current spreading layer 6 can be formed on the clad layer 5 under conditions of low temperature.

Figure 1:
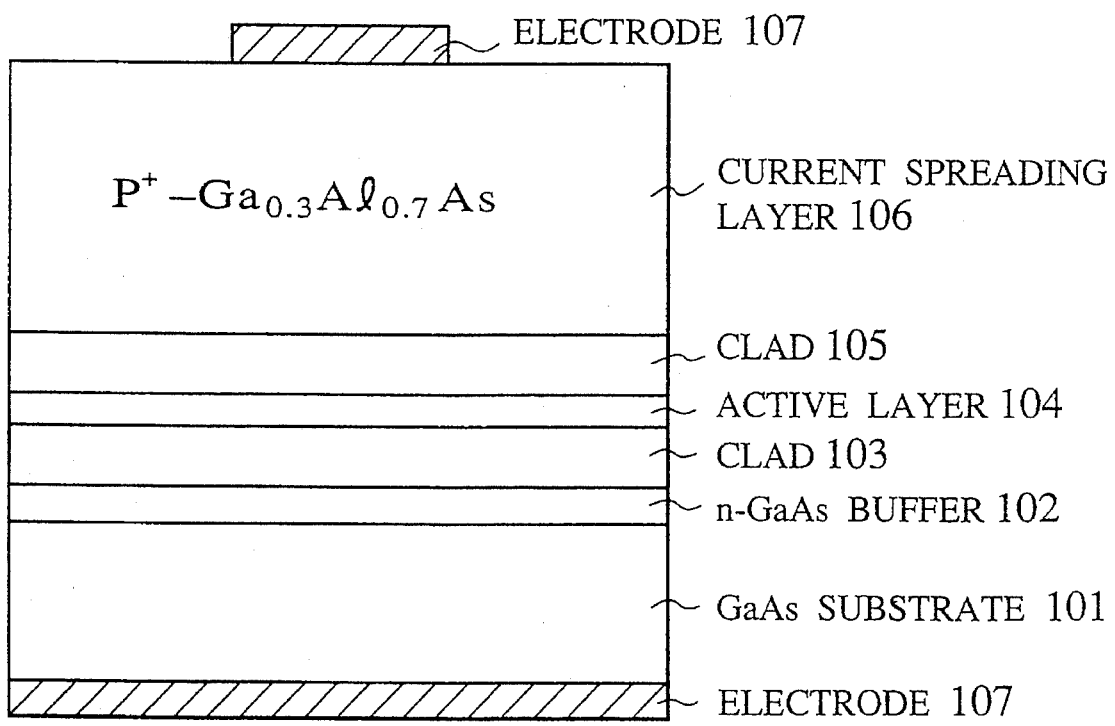
FIG. 1 is a sectional view showing the structure of a conventional light-emitting semiconductor device.

Conventionally, p$^+$-$Ga_{0.3}Al_{0.7}As$ is used for the current spreading layer 106 as shown in FIG. 1. In this conventional example, the current spreading layer 6 must be formed on the clad layer 5 at a high temperature. For this reason, damage is incurred on the clad layers 103, 105, the active layer 104, and the substrate 101. The manufacturing conditions are therefore very strict. This type of problem is eliminated in the case of the present invention, therefore the cost of manufacturing is reduced and the yield is improved.

In addition, the water resistance of the ZnTe which is the material for the current spreading layer 6 is good. The ZnTe has the characteristic of preventing the entrance of external water or humidity, therefore the life span of the semiconductor light-emitting device of the present invention can be increased.

What is claimed is:

1. A semiconductor light emitting device comprising:

a semiconductor substrate;

a first semiconductor layer having a first conductivity type formed on said semiconductor substrate;

a second semiconductor layer having a second conductivity type opposite said first conductivity type formed on said first semiconductor layer and serving as an active layer capable of emitting light when an electric current is passed therethrough;

a current spreading layer having said second conductivity type formed on said second semiconductor layer, wherein said current spreading layer includes bulk zinc telluride.

2. A semiconductor light-emitting device as claimed in claim 1, wherein the resistivity of the current spreading layer is 0.1 $\Omega$cm or less.

3. A semiconductor light-emitting device as claimed in claim 1, wherein the film thickness of the current spreading layer is about 7 μm.

4. A semiconductor light-emitting device as claimed in claim 1, wherein the device further comprises a reflective layer formed between the active layer and the current spreading layer for reflecting light emitted from the active layer to the current spreading layer.

5. A semiconductor light-emitting device as claimed in claim 1, wherein the device further comprises a current blocking layer formed in the current spreading layer for locally preventing the flow of electric current supplied from the electrodes to the active layer.

6. A semiconductor light-emitting device as claimed in claim 1, wherein the device further comprises:

a reflective layer formed between the active layer and the current spreading layer for reflecting light emitted from the active layer to the current spreading layer side; and a current blocking layer formed in the current spreading layer for locally preventing the flow of electric current supplied from the electrodes to the active layer.

7. A semiconductor light-emitting device as claimed in claim 1, wherein the resistivity of the current spreading layer is about 0.05 $\Omega$cm.

* * * * *